(12) United States Patent
Liao et al.

(10) Patent No.: US 9,318,338 B2
(45) Date of Patent: Apr. 19, 2016

(54) METHOD FOR FABRICATING SEMICONDUCTOR DEVICE

(71) Applicant: UNITED MICROELECTRONICS CORPORATION, Hsinchu (TW)

(72) Inventors: Bor-Shyang Liao, Kaohsiung (TW); Tsung-Hsun Tsai, Chiayi County (TW); Kuo-Chih Lai, Tainan (TW); Pin-Hong Chen, Yunlin County (TW); Chia-Chang Hsu, Kaohsiung (TW); Shu-Min Huang, Tainan (TW); Min-Chung Cheng, Chiayi County (TW); Chun-Ling Lin, Tainan (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 13/969,616

(22) Filed: Aug. 19, 2013

(65) Prior Publication Data

US 2015/0050799 A1    Feb. 19, 2015

(51) Int. Cl.
| | |
|---|---|
| H01L 21/322 | (2006.01) |
| H01L 21/283 | (2006.01) |
| H01L 21/28 | (2006.01) |
| H01L 29/78 | (2006.01) |
| H01L 21/8238 | (2006.01) |
| H01L 21/285 | (2006.01) |

(52) U.S. Cl.
CPC ........ *H01L 21/283* (2013.01); *H01L 21/28123* (2013.01); *H01L 21/823807* (2013.01); *H01L 21/823814* (2013.01); *H01L 29/7833* (2013.01); *H01L 29/7834* (2013.01); *H01L 21/28518* (2013.01)

(58) Field of Classification Search
USPC .......... 257/374; 438/199, 275, 229, 476, 592, 438/585
See application file for complete search history.

(56) References Cited

U.S. PATENT DOCUMENTS

| | | | |
|---|---|---|---|
| 8,288,291 B2 | 10/2012 | Sioncke | |
| 8,795,542 B2* | 8/2014 | Adhiprakasha | ................. 216/99 |
| 2004/0121526 A1* | 6/2004 | Yamamoto | ..................... 438/142 |
| 2005/0184299 A1* | 8/2005 | Matsumura et al. | ............ 257/79 |
| 2008/0090369 A1* | 4/2008 | Akiyama et al. | ............... 438/308 |
| 2009/0256211 A1* | 10/2009 | Booth et al. | ................... 257/407 |
| 2010/0330764 A1* | 12/2010 | Akiyama et al. | ............... 438/308 |
| 2011/0104893 A1* | 5/2011 | Zhang | ............... H01L 21/28052 438/653 |
| 2012/0248551 A1 | 10/2012 | Baars | |
| 2012/0273010 A1 | 11/2012 | Duong | |
| 2013/0029495 A1 | 1/2013 | Adhiprakasha | |

* cited by examiner

*Primary Examiner* — Fernando L Toledo
*Assistant Examiner* — Lawrence-Linh T Nguyen
(74) *Attorney, Agent, or Firm* — Ding Yu Tan

(57) ABSTRACT

A method for fabricating a semiconductor device is provided. The method includes the following steps. Firstly, a substrate having a nitride layer and a platinum (Pt)-containing nickel (Ni)-semiconductor compound layer is provided. Then the nitride layer and the Pt are removed in situ with a chemical solution including a sulfuric acid component and a phosphoric acid component.

10 Claims, 4 Drawing Sheets

METHOD FOR FABRICATING SEMICONDUCTOR DEVICE

FIELD OF THE INVENTION

The present invention relates to semiconductor processing techniques, and more particularly to a method for fabricating a semiconductor device.

BACKGROUND OF THE INVENTION

In a process for fabricating a semiconductor device, the wafer is usually polluted by platinum atoms so as to cause electric leakage of the semiconductor device. However, it is difficult to remove the platinum because of the stability of platinum. Therefore, it is desirable to find new approaches for solving the platinum pollution problem on the wafer without increasing the overall processing time and costs.

SUMMARY OF THE INVENTION

In accordance with an aspect, the present invention provides a method for fabricating a semiconductor device. The method includes the following steps. Firstly, a substrate having a nitride layer and a platinum (Pt)-containing nickel (NO-semiconductor compound layer is provided. Then the nitride layer and the Pt are removed in situ with a chemical solution including a sulfuric acid component and a phosphoric acid component.

In an embodiment, a ratio of the sulfuric acid component to the phosphoric acid component is in a range of 1:1 to 10:1.

In an embodiment, a ratio of the sulfuric acid component to the phosphoric acid component is in a range of 3:1 to 4:1.

In an embodiment, the chemical solution further includes a hydrogen peroxide component.

In an embodiment, a ratio of the sulfuric acid component to the hydrogen peroxide component is 7:1.

In an embodiment, removing the nitride layer with the chemical solution is at 220 angstroms per minute.

In an embodiment, the step of providing the substrate having the nitride layer and the Pt-containing Ni-semiconductor compound layer comprises forming the nitride layer as being a patterned hard mask to expose a source/drain region on the substrate; and forming the Pt-containing Ni-semiconductor compound layer on the source/drain region.

In an embodiment, the method further comprises a step of removing a first gate hard mask over a first gate structure as being adjacent to the source/drain region so that the Pt-containing Ni-semiconductor compound layer is formed on the first gate structure as well as the source/drain region concurrently.

In an embodiment, a first spacer on a sidewall of the first gate structure is removed as along with the step of in situ removing the nitride layer and the Pt with the chemical solution.

In an embodiment, the semiconductor substrate has an active zone and a non-active zone, a first gate structure and a source/drain region disposed in the active zone, a second gate structure disposed in the non-active zone, and the step of providing the substrate having the nitride layer and the Pt-containing Ni-semiconductor compound layer comprises forming the nitride layer as being a second spacer on a sidewall of the second gate structure; and forming the Pt-containing Ni-semiconductor compound layer on the source/drain region.

In an embodiment, the step of in situ removing the nitride layer and Pt with the chemical solution comprises removing a part of the second spacer.

In an embodiment, in situ removing the nitride layer and the Pt with the chemical solution at a temperature between 165° C. and 220° C.

In accordance with another aspect, the present invention provides a method for fabricating a semiconductor device. The method includes the following steps. Firstly, a semiconductor substrate having a first gate structure and a source/drain region is provided. Then, a patterned hard mask over the semiconductor substrate is formed so as to expose the source/drain region. Next, a platinum (Pt)-containing nickel (Ni)-semiconductor compound layer is formed on the source/drain region. Finally, a first removal process is performed to in situ remove the patterned hard mask and the Pt with a chemical solution including a sulfuric acid component and a phosphoric acid component.

In an embodiment, the semiconductor substrate has an active zone and a non-active zone, the first gate structure and the source/drain region are disposed in the active zone, and the patterned hard mask is removed with the chemical solution so as to expose a second gate hard mask over a second gate structure and a second spacer on a sidewall of the second gate structure in the non-active zone.

In an embodiment, after the first removal process is performed, the method further comprises a step of performing a second removal process to in situ remove a part of the second spacer and the Pt with the chemical solution.

In an embodiment, between the first and second removal process, the method further comprises a step of removing a first gate hard mask layer over the first gate structure and the second gate hard mask layer so as to expose the first gate structure and the second gate structure.

In an embodiment, after the second removal process is performed, the method further comprises steps of removing a dummy structure so as to create a trench inside the first gate structure; and fill a metal material into the trench so as to form a metal gate structure.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
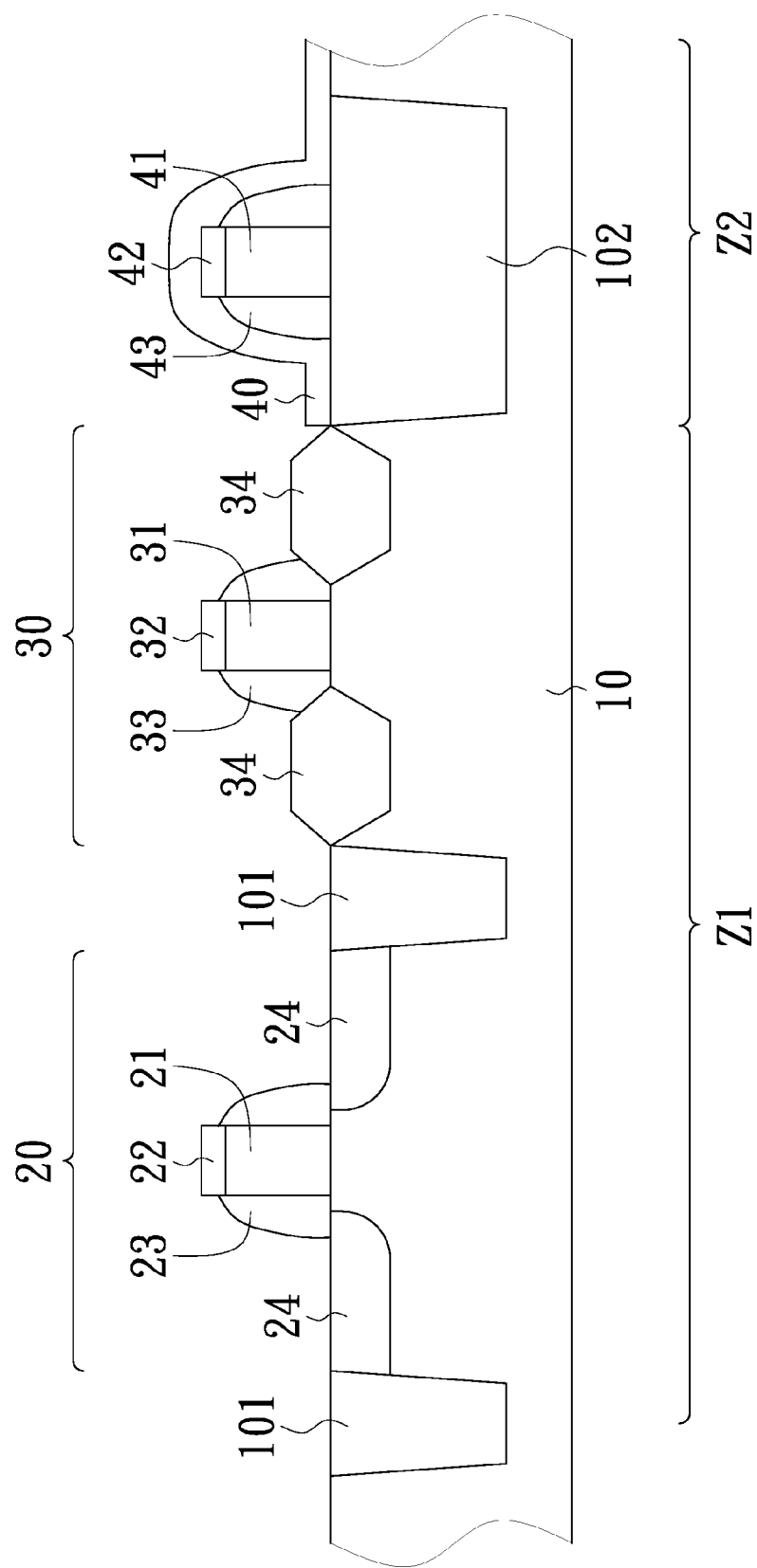
FIGS. 1-3 are cross-sectional views, combined to illustrate a method for fabricating a semiconductor device in accordance with an embodiment of the present invention.
Figure 2:
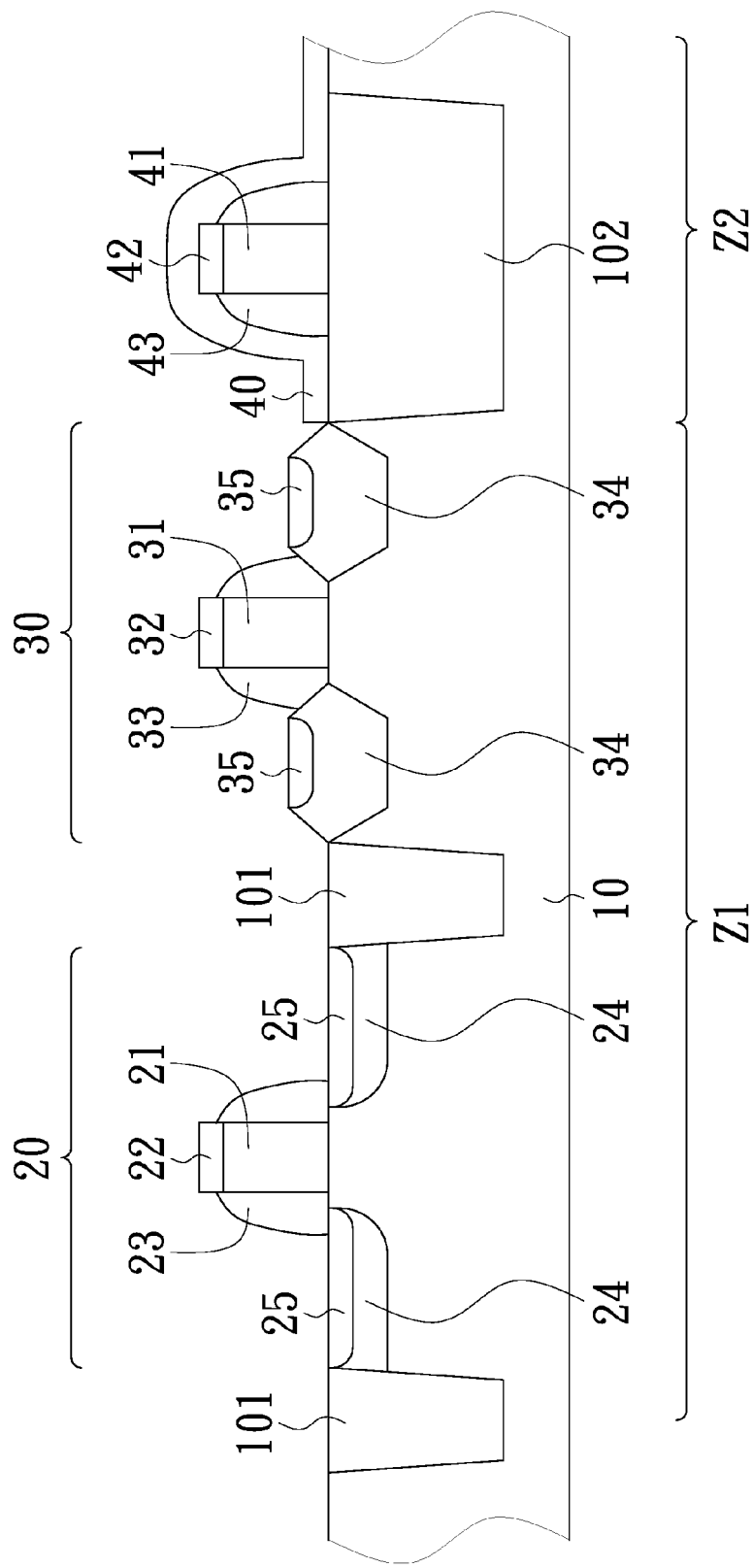
Figure 3:
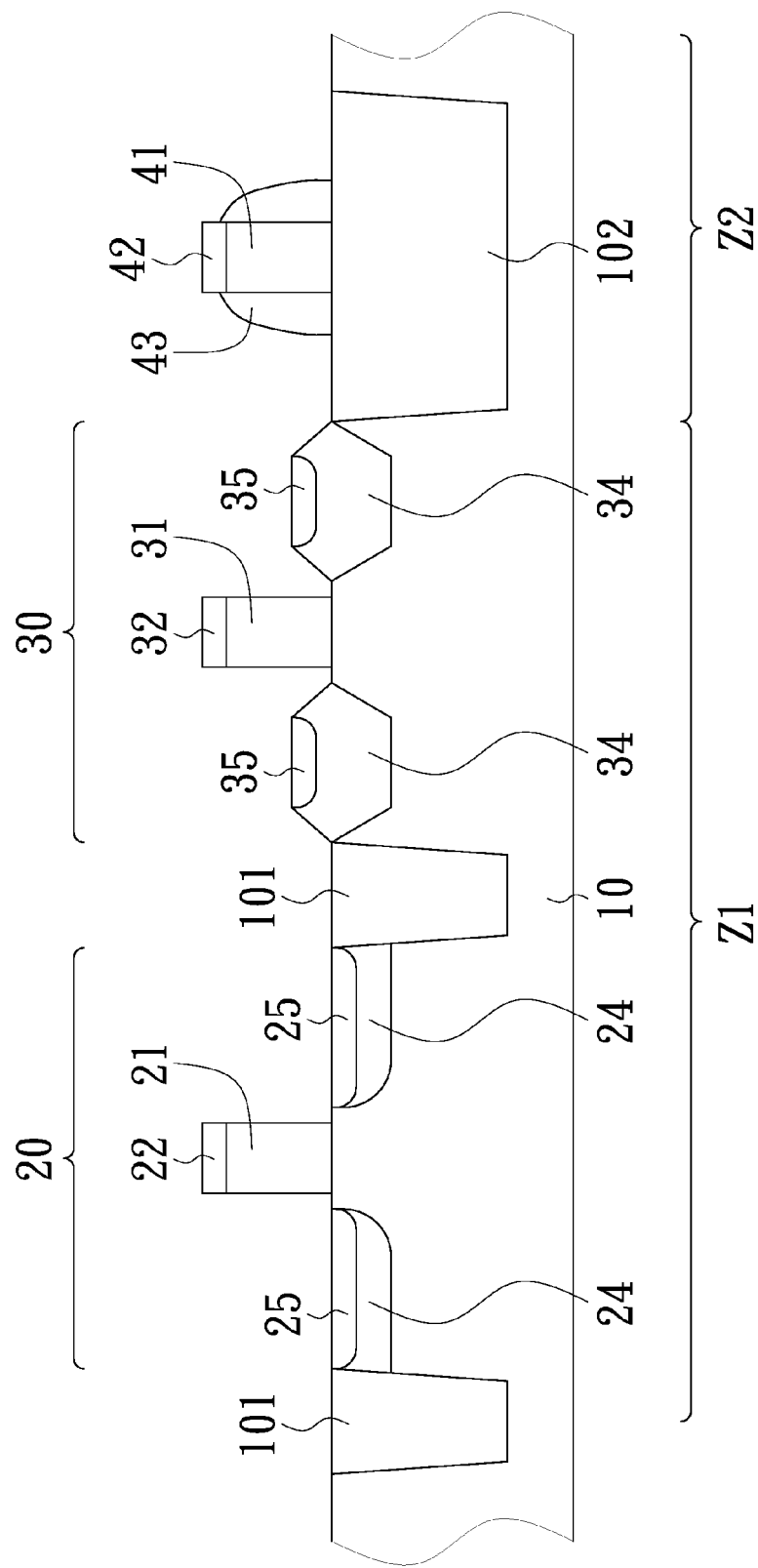

With reference to FIG. 1~FIG. 3, a method for fabricating a semiconductor device in accordance with an embodiment of the present invention and the resulting semiconductor structure are schematically illustrated. Please refer to an example case of having high dielectric constant K insulating layer and a metal gate (HK/MG) in a gate-last process. Firstly, a substrate 10 is provided. The substrate 10 may be made of silicon (Si). Then, an active zone Z1 and a non-active zone Z2 may be defined in the substrate 10. The active zone Z1 may have at least one transistor, such as, a p-typed metal-oxide-semiconductor transistor (PMOS), an n-typed metal-oxide-semiconductor transistor (NMOS), a complementary metal-oxide-semiconductor transistor (CMOS), or other semiconductor transistor. In this embodiment, a CMOS transistor includes a NMOS region 20 and a PMOS region 30 separated by a shallow trench isolation (STI) 101.

As shown in FIG. 1, a first gate structure 21 with a first gate hard mask 22 thereon is disposed on the substrate 10 in the NMOS region 20. A first spacer 23 is disposed on a sidewall of the first gate structure 21 and a source/drain region 24 is disposed beside and underneath the first spacer 23. Similarly, a first gate structure 31 with a first gate hard mask 32 thereon is disposed in the PMOS region 30. A first spacer 33 is on a sidewall of the first gate structure 31. A source/drain region 34 located besides the first spacer 33 may be made of Silicon-germanium (SiGe) to adjust the channel stress. In addition, a STI 102 is disposed in the non-active zone Z2. A second gate structure 41 with a second gate hard mask 42 thereon and a second spacer 43 on a sidewall thereof are disposed on the STI 102. Besides, in the gate-last process, the first gate structures 21 and 31 may serve as dummy gate structures and have dummy structures insides, wherein the dummy structures may be made of poly-silicon.

In this embodiment, before a self-aligned silicide (SALICIDE) process, a patterned hard mask layer 40, called a "salicide block", has been formed over the semiconductor substrate 10 to expose the source/drain regions 24 and 34. The step of forming the patterned hard mask layer 40 includes the following: a hard mask layer (not shown) is deposited over the resulting semiconductor structure as described above so as to cover the active zone and the non-active zone, wherein the hard mask layer may be a single layer or multi-layer structure including of an oxide layer and a nitride layer or just pure nitride layer; then the hard mask layer is patterned by photolithography and etching processes so as to uncover the active zone. Thus, surfaces of the source/drain regions 24 and 34 are exposed from the patterned hard mask layer 40. The salicide block may have a thickness of 160 angstroms to 200 angstroms.

Next, a silicidation (SALICIDE) process is performed to form a platinum (Pt)-containing nickel (Ni)-semiconductor compound layer 25 and a platinum (Pt)-containing nickel (Ni)-semiconductor compound layer 35 on the source/drain regions 24 and 34 (as shown in FIG. 2), respectively. For instance, a Pt/Ni layer is first sputtered on the substrate 10. The Pt serves as a Ni-semiconductor compound stabilizer. Then a first rapid thermal process (RTP) is performed to conduct a chemical reaction between Ni and the semiconductor exposed from surfaces of the source/drain regions 24 and 34 so as to form the Pt-containing Ni-semiconductor compound layer 25 and the Pt-containing Ni-semiconductor compound layer 35, such as a nickel silicide layer. After unreacted Ni is stripped, the Pt-containing Ni-semiconductor compound layer 25 and 35 is annealed by a second RTP or other anneal techniques to convert high resistance nickel silicide phase $Ni_2Si$ to low resistance nickel silicide phase NiSi.

Then, a first removal process is performed. As shown in FIG. 3, removal of the nitride layer, such as, the patterned hard mask layer 40, is performed with an aqueous solution of phosphoric acid. However, during the removal of the nitride layer with the aqueous solution of phosphoric acid while conducting the first removal process, the surface of the substrate 10 would be polluted by the Pt atoms from the Pt-containing Ni-semiconductor compound layer 25. Because the pollution of Pt would lead to electric leakage of the semiconductor device, an aqueous solution of sulfuric acid was then applied or utilized to strip the Pt after the removal of the nitride layer. Thus, the removal of the nitride layer and the removal of the Pt are performed with different chemicals in different chambers. That is, one chamber is exclusively used for the removal of the nitride layer with the aqueous solution of phosphoric acid and an another chamber is exclusively used for the removal of the Pt with aqueous solution of sulfuric acid. However, it is found that ex situ removal of the nitride layer and the Pt would increase the overall processing time and costs.

It is to be noted that according to the embodiment of the present invention, in situ removing of the nitride layer and the Pt with a chemical solution including a sulfuric acid component ($H_2SO_4$) and a phosphoric acid component ($H_3PO_4$) is provided. A ratio of the sulfuric acid component to the phosphoric acid component may be in a range of 1:1 to 10:1. A better ratio thereof may be in a range of 3:1 to 4:1. Moreover, due to the sulfuric acid component, the removal of the nitride layer and the Pt can be performed at higher temperature in a temperature range of 165° C. to 220° C. resulting in higher etching rate of the nitride layer and the Pt. Hence, the removal of the nitride layer and the Pt in one chamber at the same time not only saves the overall processing time and costs, but also enhances removal efficiency.

In one embodiment of the present invention, the chemical solution maybe further includes a hydrogen peroxide component ($H_2O_2$). A mixture of the sulfuric acid component and the hydrogen peroxide component is called or abbreviated as SPM. A ratio of the sulfuric acid component to the hydrogen peroxide component may be 7:1. A ratio of the SPM to the phosphoric acid component may be in a range of 1:1 to 10:1. A better ratio of the SPM to the phosphoric acid component may be in a range of 3:1 to 4:1. The hydrogen peroxide component is found to be capable of stabilizing the sulfuric acid component and enhancing the efficiency of removal of the nitride layer and the Pt. For instance, the removal of the nitride layer only with the aqueous solution of phosphoric acid is at 80~100 angstroms per minute, preferably at 90 angstroms per minute. In contrast, the removal of the nitride layer with the chemical including the SPM and the phosphoric acid component is at 150~250 angstroms per minute, preferably at 220 angstroms per minute. Thus, in situ removing of the nitride layer and the Pt with the chemical solution including the SPM and the phosphoric acid component not only offer savings on the overall processing time and costs, but also enhances removal efficiency.

In one embodiment of the present invention, the first spacers 23 and 33 may be a single-layer or multi-layer structure including a nitride layer. Thus, the first spacers 23 and 33 may be removed as together along with the step of in situ removing the patterned hard mask 40 and Pt with the chemical solution, as shown in FIG. 3. In addition, the patterned hard mask layer 40 is removed so as to expose the second gate hard mask 42 and the second spacer 43 on a sidewall of the second gate structure 41 in the non-active zone Z2.

Figure 4:
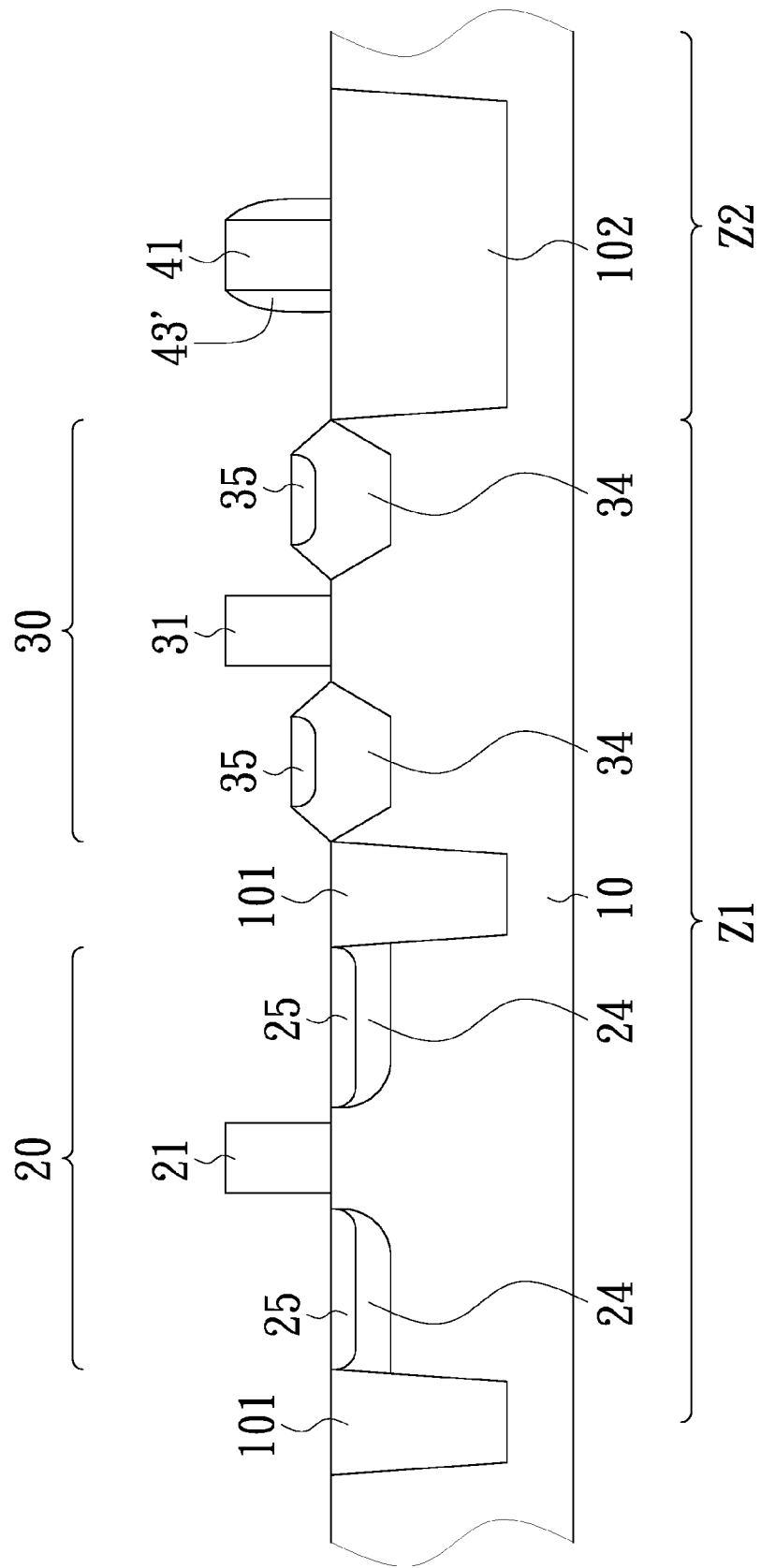
FIG. 4 schematically illustrates a method for fabricating a semiconductor device in accordance with another embodiment of the present invention.

In one embodiment of the present invention, the first gate hard mask layers 22, 32 and the second hard mask layer 42 are etched so that top surfaces of the first gate structures 21, 31 and the second gate structure 41 are exposed, as shown in FIG. 4. Then, the second spacer 43 including a nitride layer is etched by the aqueous solution of phosphoric acid to form a slim second spacer 43' so as to increase a distance between the slim second spacer 43' and the first gate structure 31 for improving the performance of the semiconductor device. As a result, the surface of the substrate 10 would be polluted by the Pt atoms from the Pt-containing Ni-semiconductor compound layer 25 during the partial removal of the second spacer 43. Thus, the second removal process is performed to in situ remove a part of the second spacer 43 and the Pt with the chemical solution including the $H_2SO_4$ and the $H_3PO_4$ or the SPM and the $H_3PO_4$ so that the adverse influence of the Pt pollution on the wafer can be reduced effectively. Consequently the in-situ removal with the chemical solution may achieve the advantage of lessening or reducing the overall processing time and costs and increasing removal efficiency.

Since the top surfaces of the first gate structure 21 and 31 are exposed, the dummy structures are removed to create a trench inside an inter-layer dielectric (ILD) (not shown). Then a metal material is filled into the trench so as to complete a metal gate structure. The metal gate may be made of aluminum (Al).

In one embodiment of the present invention, before the SALICIDE process, the first gate hard mask 22 and the first gate hard mask 32 may be removed so as to expose the top surfaces of the first gate structure 21 and the first gate structure 31. Then, when the SALICIDE process is performed, the Pt-containing Ni-semiconductor compound layer is formed not only on the source/drain region 24 and the source/drain region 34, but also on the first gate structure 21 and first gate structure 31 concurrently (not shown).

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating a semiconductor device, the method comprising steps of:
    providing a substrate having a nitride layer and a platinum (Pt)-containing nickel (Ni)-semiconductor compound layer, wherein the substrate has an active zone and a non-active zone, a first gate structure and a source/drain region disposed in the active zone, a second gate structure disposed in the non-active zone, and the step of providing the substrate having the nitride layer and the Pt-containing Ni semiconductor compound layer comprises:
        forming the nitride layer as being a second spacer on a sidewall of the second gate structure and as being a patterned hard mask to expose a source/drain region on the substrate; and
        forming the Pt-containing Ni semiconductor compound layer on the source/drain region; and
    in situ removing the nitride layer and platinum (Pt) atoms from the platinum (Pt)-containing nickel (Ni) semiconductor compound layer with a chemical solution including a sulfuric acid component and a phosphoric acid component.

2. The method according to claim 1, wherein a ratio of the sulfuric acid component to the phosphoric acid component is in a range of 1:1 to 10:1.

3. The method according to claim 1, wherein a ratio of the sulfuric acid component to the phosphoric acid component is in a range of 3:1 to 4:1.

4. The method according to claim 1, wherein the chemical solution further includes a hydrogen peroxide component.

5. The method according to claim 4, wherein a ratio of the sulfuric acid component to the hydrogen peroxide component is 7:1.

6. The method according to claim 4, wherein removing rate of the nitride layer with the chemical solution is at 220 angstroms per minute.

7. The method according to claim 1, further comprising a step of:
    removing a first gate hard mask over a first gate structure as being adjacent to the source/drain region so that the Pt-containing Ni-semiconductor compound layer is formed on the first gate structure as well as the source/drain region concurrently.

8. The method according to claim 7, wherein a first spacer formed on a sidewall of the first gate structure is removed as along with the step of in situ removing the nitride layer and the Pt with the chemical solution.

9. The method according to claim 1, wherein the step of in situ removing the nitride layer and Pt with the chemical solution comprises removing a part of the second spacer.

10. The method according to claim 1, wherein in situ removing the nitride layer and the Pt with the chemical solution at a temperature between 165° C. and 220° C.

* * * * *